United States Patent [19]

Nakamura et al.

[11] Patent Number: 5,043,387
[45] Date of Patent: Aug. 27, 1991

[54] EPOXY RESIN REACTED WITH PRIMARY AMINE, ACTIVE HYDROGEN COMPOUND AND ESTERIFYING AGENT TO YIELD POLYOL RESIN

[75] Inventors: Hideo Nakamura; Masaru Wakizaka; Yohzoh Yamamoto, all of Ichihara, Japan

[73] Assignees: Mitsui Petrochemical Industries, Ltd.; Ricoh Company, Ltd., both of Tokyo, Japan

[21] Appl. No.: 332,991

[22] Filed: Apr. 4, 1989

[30] Foreign Application Priority Data

Apr. 4, 1988 [JP] Japan ................................. 63-82610
Apr. 4, 1988 [JP] Japan ................................. 63-82611

[51] Int. Cl.$^5$ ............................................. C08G 59/16
[52] U.S. Cl. ................................ 528/113; 525/533; 525/531; 528/104; 528/111.5
[58] Field of Search ............... 525/533, 531; 528/11.5, 528/113, 104

[56] References Cited

U.S. PATENT DOCUMENTS

| 3,471,421 | 10/1969 | Vegter et al. ................. 525/533 |
| 3,477,974 | 11/1969 | Van Steveninck et al. ........ 525/533 |
| 4,292,195 | 9/1981 | Morris ........................ 528/104 |
| 4,302,373 | 11/1981 | Steinmetz ..................... 525/533 |
| 4,522,984 | 6/1985 | Watanabe et al. ............... 525/533 |
| 4,698,402 | 10/1987 | Kordomenos et al. ............. 525/533 |
| 4,714,745 | 12/1987 | Kondomenos et al. ............. 525/533 |
| 4,780,524 | 10/1988 | Dobblestein et al. ............ 528/104 |
| 4,812,533 | 3/1989 | Simone et al. ................. 525/533 |
| 4,829,105 | 5/1989 | Yamada et al. ................. 525/533 |

FOREIGN PATENT DOCUMENTS 2117382 10/1983 United Kingdom ................ 525/533

Primary Examiner—Melvyn I. Marquis
Assistant Examiner—Robert E. L. Sellers II
Attorney, Agent, or Firm—Birch, Stewart, Kolasch & Birch

[57] ABSTRACT

There is provided a process for preparing a novel polyol resin which does not substantially contain epoxy group wherein a bisphenol type epoxy resin (a) is subjected to the following steps (i), (ii) or (i), (iii) and (ii) in an optional sequence:

(i) the step wherein epoxy group is reacted with a compound having one active hydrogen in its molecule (c), and
(ii) the step wherein secondary hydroxyl group is at least partly esterified.
(iii) the step wherein epoxy group is reacted with primary amine (b).

9 Claims, No Drawings

EPOXY RESIN REACTED WITH PRIMARY AMINE, ACTIVE HYDROGEN COMPOUND AND ESTERIFYING AGENT TO YIELD POLYOL RESIN

BACKGROUND OF THE INVENTION

This invention relates to a polyol resin derived from epoxy resin and process for preparing the same, and more specifically relates a polyol resin which possesses flexibility, high crosslinking reactivity and high storage stability and is suitably used for baking type coating material, or the like.

Among bisphenol type epoxy resins, those having high molecular weight have considerable amounts of secondary hydroxyl groups in their molecular chains and hence can be considered to be a type of polyol resin. It has been, therefore, known that a bisphenol type high molecular weight epoxy resin is used as the polyol component of polyurethane paint.

Nevertheless, the film of a coating finally formed in such paint is brittle due to the toughness inherent in bisphenol type epoxy resin. Moreover, coating compositions whose baking cycles are short, that is to say, whose curing time is short, is desirable in setting up an energy-efficient coating process line. Emergence of such a polyol component which imparts a higher reactivity has, therefore, been desired.

Moreover, high molecular weight epoxy resin cannot be used for the coating material which is used in a compounded form with tar or asphalt, since the epoxy group contained therein, small as it may be in amount, would still increase the viscosity of the paint after a lapse of time in the case the paint, is mixed with tar or asphalt, to the extent that the storage stability of the paint is impaired.

SUMMARY OF THE INVENTION

It is an object of this invention to provide, through resolving the above-mentioned problems, a novel polyol resin which is prepared from bisphenol type epoxy resin as the starting raw material and, when it is used as the polyol component of the said coating material, which provides a flexible film of coating material with a short curing time and exhibits stability over an extended period of time even in cases where it is mixed with asphalt, tar, or the like.

The inventors of the present invention worked on means for overcoming the shortcomings of epoxy resin as the polyol component for such uses.

Consequently, this invention has been established by way of such discovery that by means of reacting epoxy resins with primary amines to render the chain length of the epoxy resin extended, reacting the terminal epoxy groups with a monovalent active hydrogen-containing compound, and thus esterifying secondary hydroxyl group, the hard and brittle epoxy resin is characterized with an adequate flexibility and at the same time the viscosity does not increase even if tar, asphalt, or the like is compounded, and a high storage stability is achieved.

According to this invention, there is provided a process for preparing a novel polyol resin which does not substantially contain epoxy group wherein a bisphenol type epoxy resin (a) is subjected to the following steps (i) and (ii) in an optional sequence:

(i) the step wherein epoxy group is reacted with a compound having one active hydrogen in its molecule (c), and (ii) the step wherein secondary hydroxyl group is at least partly esterified.

On the other hand, this invention has been established by way of such discovery that by means of reacting the terminal epoxy groups with a monovalent active hydrogen-containing compound, and thus esterifying secondary hydroxyl group with lactones and/or monocarboxylic acid or its ester derivative, the hard and brittle epoxy resin is characterized with an adequate flexibility and at the same time the reactivity of secondary hydroxyl group is increased by the effect imparted by the amines used for extending the chain length, and moreover the viscosity does not increase even if tar, asphalt, or the like is compounded, and a high storage stability is achieved.

According to this invention, there is provided a process for preparing a novel polyol resin which does not substantially contain epoxy group wherein a bisphenol type epoxy resin (a) is subjected to the following steps (iii), (iv), and (v) in a optional sequence:

(iii) the step wherein epoxy group is reacted with primary amine (b), (iv) the step wherein epoxy group is reacted with a compound having one active hydrogen in its molecule (c), and (v) the step wherein secondary hydroxyl group is at least partly esterified.

There are also provided novel polyol resins prepared by the above processes.

DETAILED DESCRIPTION OF THE INVENTION

The polyol resin of the present invention is derived from a bisphenol type epoxy resin (a), as represented by the general formula (I), which may be prepared by a reaction between a bisphenol and a haloepoxide such as epichlorohydrin and $\beta$-methylepichlorohydrin.

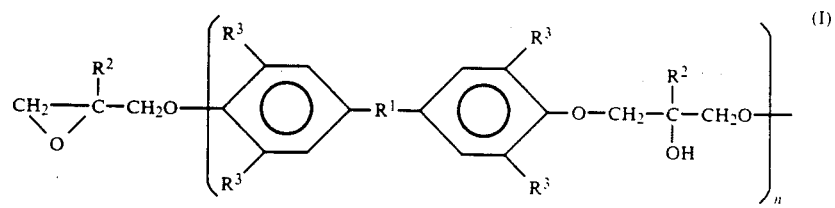

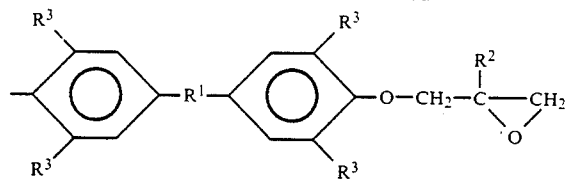

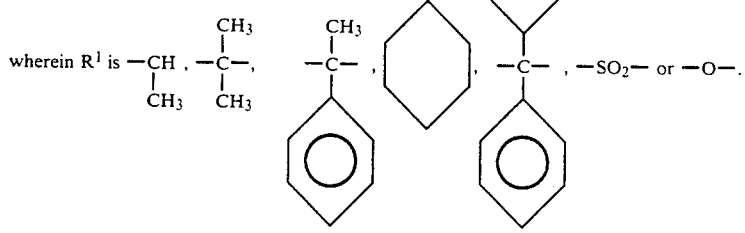

R² is hydrogen atom or methyl group;
R³ is hydrogen atom or a halogen atom; and
n is a number of the repeating structural unit including zero.

Preferred among these bisphenol type epoxy resins are glycidyl ether or β-methylglcidyl ether of bisphenols, which are exemplified as follows:
2,2-bis(hydroxyphenyl)propane(so-called bisphenol A);
bis(4-hydroxyphenyl)methane(so-called bisphenol F); and
1,1-bis(4-hydroxyphenyl)ethane(so-called bisphenol AD).

Among these bisphenol type epoxy resins, glycidyl ether of 2,2-bis(hydroxyphenyl)propane is specifically preferred.

The bisphenol type epoxy resin (a) therein used preferably has an epoxy equivalent of generally 150 to 3500, and more preferably 160 to 2500.

The other compound which is reacted with the epoxy group in the step (i) is the compound (c) having an active hydrogen atom in the molecule, wherein this active hydrogen is such a hydrogen that is reactive with epoxy group.

Exemplified in the following are these compounds (c), of which one or more types may be used:

(1) secondary amines, such as dipropyl amine, dihexyl amine, dicylohexyl amine, dioctyl amine, distearyl amine, N-methyl aniline, and N-ethyl aniline, among which those having 6 to 40 carbon atoms are preferred;

(2) Monovalent phenols, such as phenol, cresol, isopropyl phenol, amyl phenol, nonyl phenol, dodecyl phenol, xylenol, p-cumylphenol, among which those having 6 to 40 carbon atoms are preferred; and (3) Monovalent carboxylic acids, such as acetic acid, propionic acid, capric acid, lauric acid, myristic acid, palmitic acid, stearic acid, acrylic acid, oleic acid, margaric acid, arabonic acid, lionlic acid, linoleic acid, fatty acid of castor oil, fatty acid of tall oil, among which those having 6 to 25 carbon atoms are preferred.

Preferred among the compounds exemplified above (c) are monovalent phenols.

In this step (i) bisphenols may be allowed to coexist and react with epoxy groups. As such bisphenols those which are represented by the general formula are exemplified:

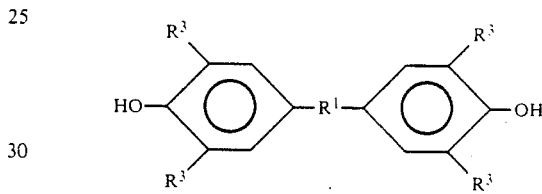

wherein R¹ and R³ are the same as have been defined.

The bisphenols which are used therein may preferably, but not necessarily, be the same as the ones used to construct the backbone of the epoxy resin (a).

When the step (i) is carried out in coexistence with bisphenols, the epoxy resin (a) which is generally used as the starting raw material has an epoxy equivalent of from 150 to 500, and preferably from 160 to 400.

It is preferable that the compound (c) be used in the step (i) in such a quantity as combined with the amount of active hydrogen in bivalent phenols will be equivalent to the amount of the epoxy group in the raw material epoxy resin (a).

Namely, the amounts of epoxy resin (a) having an epoxy equivalent of X, a compound (c) having a molecular weight of Mc, and, in case bisphenol coexists in the step (i), such bisphenol having a molecular weight of Md are most preferably sufficient to fulfill the following formula (1):

$$0.95 \leq \frac{A/X}{C/Mc + 2D/Md} \leq 1.05 \qquad (1)$$

wherein A is the amount of epoxy resin (a) in grams; C is the amount of compound (c) in grams;
D is the amount of bisphenols which exist in the step (i) depending on the prevailing condition in grams.

The catalyst which is used in the step (i) includes hydroxides of alkaline metal, such as sodium hydroxide, potassium hydroxide, lithium hydroxide; alcoholate of alkaline metal, such as sodium methylate; alkaline metal salt, such as lithium chloride, and lithium carbonate; tertiary amine, such as dimethylbenzyl amine, triethyl amine, and pyridine; quaternary ammonium salt such as tetramethyl ammonium chloride, and benzyltrimethyl ammonium chloride; methyl iodide adduct of organic phosphorous compound, such as triphenylphosphine, triethylphosphine; alkaline metal salt, such as sodium carbonate, and lithium chloride; and diethylether complex of Lewis acid, such as boron trifluoride, aluminum chloride, tin tetrachloride, and boron triboride.

The amount of catalyst used varies with the reaction temperature, but is generally 0.01 to 1000 parts by weight per million parts by weight (ppm) of the reaction material, and preferably 0.1 to 1000 ppm of the reaction material.

Although the reaction may be carried out without using a solvent, in cases where a solvent is used, a solvent which do not have active hydrogens such as hydrocarbons, such as toluene and xylene, and ketones, such as methylisobutyl ketone, methylethyl ketone, and cyclohexane are used.

The esterifying agents used in the step (ii) for esterifying secondary hydroxyl group include lactones and monocarboxylic acid or ester derivatives thereof.

Such lactones have 3 to 10 carbon atoms, and preferably 3 to 8 carbon atoms, among which are preferred $\beta$-propiolactone, $\delta$-valerolactone, $\epsilon$-caprolactone, $\gamma$-butylolactone, $\beta$-butylolactone, and $\gamma$-valerolactone, and specifically preferable are $\gamma$-butylolactone and $\epsilon$-caprolactone.

As the monovalent carboxylic acid, the same substances as the monovalent carboxylic acid which has been described in the foregoing as the compound (c) may be used, among which those having 6 to 25 carbon atoms are preferred.

As the ester derivatives of monovalent carboxylic acid, lower alkylester of the said carboxylic acid such as methylester and ethylester may be cited as preferred examples.

In cases where lactones are used as the esterifying agent, the lactones are used to the extent that the amount of polyester being graft polymerized in the finally obtained polyol resin from secondary hydroxyl group as the starting point is generally 0.5 to 30 weight percent, and preferably 2 to 20 weight percent of the polyol resin.

In cases where monocarboxylic acid or its ester is used as the esterifying agent, the monocarboxylic acid or its ester is used to the extent that the amount of ester group in the finally obtained polyol resin is about 0.5 to 30 mole percent, and preferably 1 to 20 mole percent of the total amount of hydroxyl group and ester group in the polyol resin.

The esterification reaction of secondary hydroxyl group in the step (ii) may be carried out without using a catalyst or in the presence of a catalyst at a temperature of 80 to 250° C., and preferably at a temperature of 100 to 200° C. The reaction time extends to about 3 to 10 hours.

It is desirable that the water produced in the case in which monocarboxylic acid is used as the esterifying agent is removed from the system for the purpose of completing the reaction.

Water can be removed by, for example, such apparatus as Dean-Stark, by azeotropic distillation at atmospheric pressure or a reduced pressure with water-insoluble solvent. In cases where no solvent is used, the water can be removed by carrying out the reduction at a reduced pressure.

In the case in which monocarboxylic acid ester is used as the esterifying agent, the lower alcohol produced in the reaction can be removed from the system by carrying out the reaction at a reduced pressure.

As the catalyst which can be used for the esterification reaction, organic or inorganic titanium compounds, such as tetrabutyl titanate, tetraethyl titanate, butoxyl titanium trichloride, titanium tetrachloride; organic or inorganic aluminum compounds, such as triethyl aluminum, ethyl aluminum chloride, aluminum trichloride; organic or inorganic zinc compounds, such as diethyl zinc, zinc chloride; organic or inorganic tin compounds, such as dibutyl tin laurate, tin salt; acids, such as p-toluenesulfonic acid, and phosphoric acid; alkaline metals such as lithium and sodium; alkaline metal hydroxides, such as lithium hydroxide, sodium hydroxide; alkaline metal salts, such as sodium carbonate, lithium acetate and lithium chloride; and tertiary amines, such as triethyl amine and pyridine, may be cited as examples.

These catalysts are used in the ratio of 0.01 to 1000 ppm, and preferably 0.1 to 500 ppm based on the amount of the resin.

As the solvent used in the reaction, such solvents as toluene, xylene, methylisobutyl ketone, methylethyl ketone, and cyclohexane are used, although the reaction may be carried out in the absence of a solvent.

The above-mentioned steps (i) and (ii) may be carried out in an optional sequence, although it is preferable that epoxy resin from which epoxy groups have been substantially eliminated first be obtained by the step (i), and then the step (ii) is carried out.

In cases where carboxylic acid is used as the active hydrogen containing compound (c) in the step (i), esterification reaction with secondary hydroxyl group may take place. In such a case, the steps (i) and (ii) may be carried out simultaneously. As a matter of course, in the case in which the esterification reaction has not been carried out sufficiently, the step (ii) may be further carried out.

The novel polyol resin thus prepared does not substantially contain epoxy group. Generally its hydroxyl value is about 150 to 250 KOH mg/g and its softening point is about 70° to 180 ° C. Its number average molecular weight is 2000 to 15000.

The polyol resin of the present invention can be used for a baking type coating material compounded with amine resin such as melamine resin, or a coating material dried at room temperature or a baking type coating material compounded with polyisocyanate or block polyisocyanate.

The polyol resin of the present invention can be also used as a modifying agent by compounding with another polyol resin, such as polyester polyol, acryl-polyol, and the like; polyethers, such as polyethylene glycol, polypropylene glycol, and the like; polyester resin; polyacrylate resin.

In using the polyol resin for various applications, it can be co-used with inorganic or organic filler, pigment, or the like, such as talc, calcium carbonate, silica, carbon, tar, and asphalt, according as the condition may require.

The other polyol resin of the present invention is also derived from a bisphenol type epoxy resin (a), as represented by the general formula (I) as described above.

The polyol resin is obtained by subjecting a bisphenol epoxy resin to the steps (iii), (iv) and (v) in an optional sequence.

Exemplified in the following are primary amines (b) which are reacted with the epoxy group of the epoxy resin (a) in the step (iii).

(1) aliphatic primary amines such as propyl amine, butyl amine, hexyl amine, octyl amine, laurylamine, stearyl amine, palmityl amine, and oleyl amine, among which those having at least 6 carbon atoms, and 12 to 20 carbon atoms are most preferred;

(2) aromatic primary amines, such as aniline, toludine, xylidine, cumidine, hexyl aniline, nonyl aniline, and dodecyl aniline, among which those having a $C_{3-20}$ alkyl group attached to the benzene ring of aniline are preferred;

(3) cycloaliphatic primary amines such as cyclopentyl amine, cyclohexyl amine, and norbornyl amine, among which those having 6 to 20 carbon atoms are preferred; and (4) aromatic nuclear substituted aliphatic primary amines such as benzyl amine, phenethyl amine, 4-phenyl-3-methylbutyl amine, and cinnamyl amine, among which those having 7 to 15 carbon atoms are preferred.

Preferred among these primary amines (b) are aliphatic primary amines having 8 to 20 carbon atoms.

The amount of primary amine (b) used may generally range from about 0.05 to about 50 parts by weight, and preferably from 0.1 to 20 parts by weight per 100 parts by weight of bisphenol type epoxy resin (a) in view of the reactivity of the polyol resin of the present invention and the toughness of the film of coating achieved when it is used in the coating material.

The other compound which is reacted with the epoxy group in the step (iv) is the same compound (c) having an active hydrogen atom in the molecule, wherein this active hydrogen is such hydrogen as is reactive with epoxy group. Exemplifications of the compound (c) is described above in step (i).

In this step (iii) bisphenols may be allowed to coexist and react with epoxy groups. As such bisphenols is the same bisphenols as described above in the step (i).

The amounts of primary amine (b) which is used in the step (iii) and the compound (c) having an active hydrogen atom in the molecule which is used in the step (iv) are preferably sufficient to fulfill the following formulas (2) and (3):

$$0.95 \leq \frac{(A/X)}{2B/Mb + C/Mc + 2D/Md} \leq 1.05 \quad (2)$$

$$2000 \leq \frac{2(A + B + C + D)}{C/Mc + |A/X - 2B/Mb - C/Mc - 2D/Md|} \leq 15000 \quad (3)$$

more preferably 3000 to 10000,
wherein A is the amount of epoxy resin (a) in grams;
B is the amount of primary amine (b) in grams;
C is the amount of compound (c) in grams;
D is the amount of bisphenols which exist in the step (iv)
depending on the prevailing condition;
X is the epoxy equivalent of epoxy resin (a);
Mb is the molecular weight of primary amine (b);
Mc is the molecular weight of compound (c); and
Md is the molecular weight of bisphenols.

The esterifying agent used in the step (v) for esterifying secondary hydroxyl group include lactones and monocarboxylic acid or ester derivatives thereof.

The exemplifications of esterifying agent is described above in step (ii).

In cases where lactones are used as the esterifying agent, the lactones are also used to the extent that the amount of polyester being graft polymerized in the finally obtained polyol resin from secondary hydroxyl group as the starting point is generally 0.5 to 30 weight percent, and preferably 2 to 20 weight percent of the polyol resin.

In cases where monocarboxylic acid or its ester is used as the esterifying agent, the monocarboxylic acid or its ester is also used to the extent that the amount of ester group in the finally obtained polyol resin is about 0.5 to 30 mole percent, and preferably 1 to 20 mole percent of the total amount of hydroxyl group and ester group in the polyol resin.

The reaction between epoxy group and primary amine (b) in the step (iii) may be carried out either in the presence of a catalyst or in the absence of a catalyst at a temperature of about 50° to 250 °C., and preferably at a temperature of 100° to 200 °C. The reaction time is about 2 to 5 hours.

The catalyst which is used in the step (iii) is the same catalyst which is used in the step (i) as described above.

The amount of catalyst used varies with the reaction temperature, but is generally 0.01 to 1000 parts by weight per million parts by weight (ppm) of the reaction material, and preferably 0.1 to 1000 ppm of the reaction material.

Although the reaction may be carried out without using a solvent, in cases where solvents is used, a solvent which do not have active hydrogens such as hydrocarbons like toluene and xylene, and ketones like methylisobutyl ketone, methylethyl ketone, and cyclohexane are used.

The step (iv) may be carried out at the same reaction temperature, with the same reaction time, using the same catalyst and solvent as those in the said step (iii).

The esterification reaction of secondary hydroxyl group in the step (v) may be carried out without using a catalyst or in the presence of a catalyst at a temperature of 80° to 250 °C., and preferably at a temperature of 100° to 200 °C. The reaction time extends to about 3 to 10 hours.

It is desirable that water produced in case monocarboxylic acid is used as the esterifying agent is removed from the system for the purpose of completing the reaction.

Water can be removed by, for example, by such apparatus as Dean-Stark, by azeotropic distillation at atmospheric pressure or a reduced pressure with water-insoluble solvent. In cases where no solvent is used, water can be removed by carrying out the reduction at a reduced pressure.

In the case in which monocarboxylic acid ester is used as the esterifying agent, lower alcohol produced in the reaction can be removed from the system by carrying out the reaction at a reduced pressure.

As the catalyst which can be used for the esterification reaction is the same catalyst which is used in step (ii) as described above.

These catalysts are used at a rate of 0.01 to 1000 parts by weight per million parts (ppm) of the resin, and preferably 0.12 to 500 ppm.

As the solvent used in the reaction, such solvents as toluene, xylene, methylisobutyl ketone, methylethyl ketone, and cyclohexane are used, although the reaction may be carried out in the absence of a solvent.

The steps (iii), (iv), and (v) may be carried out in an optional sequence. Nevertheless, the preferred processes are as follows:

(1) The reaction is carried out in this sequence: the step (iii), the step (iv), and the step (v).
(2) The reaction is carried out in this sequence: the step (iv), the step (iii), and the step (v).

(3) The reaction is carried out in this sequence: the steps (iii) and (iv) at the same time and then the step (v).

In this case the step (iv) may be carried out simultaneously, since such carboxylic acid is reacted with epoxy group, if carboxylic acid is used as the esterifying agent. If the reaction between carboxylic acid and epoxy group has not been carried out sufficiently, the step (iv) may be carried out once again.

The novel polyol resin thus prepared does not substantially contain epoxy group. Generally its hydroxyl value is about 150 to 250 KOH mg/g and its softening point is about 70° to 180 °C. Its number average molecular weight is 2000 to 15000.

The polyol resin of the present invention can be used for a baking type coating material compounded with amine resin such as melamine resin, or a coating material dried at room temperature or a baking type coating material compounded with isocyanate or block isocyanate.

The polyol resin of the present invention can be also used as a modifying agent by compounding with another polyol resin, such as polyester polyol, acrylpolyol, and the like; polyethers, such as polyethylene glycol, polypropylene glycol, and the like; polyester resin; polyacrylate resin.

In using it for various applications, it can be co-used with inorganic or organic filler, pigment, or the like, such as talc, calcium carbonate, silica, carbon, tar, and asphalt, in accordance with the condition required.

EXAMPLES

Examples of the present invention are given below by way of illustration, and not by way of limitation.

In the Examples, the epoxy equivalents and hydroxyl value were determined as described below.

Evaluation of Epoxy Equivalents 1. 0.2 g to 10 g of the resin is measured into a 200-ml Erlenmeyer flask, and is added with 25 ml of dioxane to make a solution.

2. Precisely, 25 ml of 0.2N hydrochloric acid solution (dioxane solution) is added to the Erlenmeyer flask. The flask is sealed. After thoroughly mixing the content in the sealed flask, the flask is allowed to stand for 30 minutes.

3. After adding 50 ml of toluene-ethanol mixed solution (1/1 volume ratio) to the solution, the resulting solution is titrated with 0.1N sodium hydrxide solution, using cresol red as the indicator.

4. The epoxy equivalent is calculated by the following equation:

$$A = \frac{W \times 1000}{(Q - S) \times 0.1 \times f}$$

wherein W is the weight of the resin sample in grams,
S is the volume in ml of 0.1 N sodium hydroxide added,
f is the factor of 0.1N sodium hydroxide,
Q is the volume in ml of 0.1N sodium hydroxide solution titrated in the blank test.

Evaluation of Hydroxyl Value 1. 1.5 to 2.0 g of the resin is measured into a 25-ml volumetric flask and is added with purified chloroform (after having ethanol and water contents removed with molecular sieve 4A) to make a solution. After the resin has been completely dissolved, the volumetric flask is filled up to the 25-ml level.

2. Absorbance of the sample filled in a 0.2 mm thick KBr liquid cell is measured on the 4000 m$^{-1}$ to 3000 m$^{-1}$ band, using purified chloroform as the reference.

3. The absorbances of two absorption peaks, $T_1$ and $T_2$, are computed on the basis of the base absorbance as the standard (zero). Then, the concentration of hydroxyl group (eq/l) is obtained from the values of $T_1+T_2$ in reference to a calibration curve prepared in advance. The obtained concentration of hydroxyl group is converted into the hydroxyl value by the following equation:

Hydroxyl value (mg/g) =

$$\frac{(\text{Concentration of hydroxyl group}/4) \times 56.1 \times F}{\text{Weight of the sample (g)}} \times 100$$

wherein F is the compensation for the thickness of the cell $$(F = L_1/L_2)$$

$L_1$ = The thickness of the cell used in preparation of the calibration curve (mm)
$L_2$ = The thickness of the cell used in the measurement (mm)

Preparation of the Calibration Curve 1. 0.1 g, 0.2 g, 0.3 g, 0.4 g, 0.5 g, and 0.6 g of purified diethylene glycol dehydrated with molecular sieve are measured into 25-ml Erlenmeyer flasks respectively, and each flask is filled up to the 25-ml level with purified chloroform.

These are standard liquids having hydroxyl equivalents of 0.075, 0.151, 0.226, 0.301, 0.376, and 0.452 eq/l.

2. Absorbances of these standard liquids are measured on the 4000 to 3000 cm$^{-1}$ band, using KBr liquid cell (0.2 mm).

3. The absorbances of two absorption peaks, $T_1$ and $T_2$, are computed on the basis of the base absorbance as the standard. Then, the relationship between the $T_1+T_2$ value and the hydroxyl equivalent is plotted into a calibration curve.

EXAMPLES 1

A 1-liter separable flask equipped with a stirrer, a thermometer, a nitrogen inlet, and a condenser was charges with 200 g of bisphenol A type epoxy resin, having epoxy equivalent of 187 g/eq, 109.7 g of bisphenol A, 20.8 g of p-cumylphenol, and 50 ml of xylene.

The contents began to be heated in nitrogen atmosphere and 0.3 ml of aqueous solution of lithium chloride was added at the temperature reached 70 °C. Then, the content was heated to 185 °C., during which period xylene was stripped off at a reduced pressure. By agitating the content at a pressure of 5 mmHg and at a temperature of 185 °C. for 1 hour, xylene was completely removed.

After restoring the pressure, the reaction was carried out for 5 hours. 17.4 g of (-caprolactone was added, and the reaction was carried out for 6 hours at 185 °C., and a resin having the OH value of 201 KOH mg/g was obtained. The obtained resin was diluted with a solvent prepared by mixing equal weights of methylisobutyl ketone and toluene to the nonvolatile concentration of 45.0%.

The thus obtained polyol resin was evaluated with respect to the following items in the form of a cured film of coating prepared by compounding it with polyurethane resin (Takenate D-102 manufactured by Takeda Pharmaceutical Co.) at the NCO/OH equivalent ratio of 0.8.

(1) Drying property

A mixture of polyol resin and polyurethane resin was applied to the surface of a 2 mm thick glass plate to the extent that a 500 micron film of coating is formed. The lapse of time up to the point in time where the needle of the RI tester (manufactured by Nippon Rigaku Kogyo) no longer penetrates the wet film of coating at 20 °C. was defined to be "semi-cured time."

(2) Tensile Strength and Elongation

A mixture of polyol resin and polyurethane resin was applied to the polished surface of carbon steel (SS41), upon which, mold release agent had been sprayed, to yield a 400 micron thick wet film of coating. The thus prepared film was allowed to stand at room temperature for 33 hours, and, then, was heated at 60 °C. for 24 hours into a cured film. After removing the film from the carbon steel plate, test specimens of Pattern No.2 of JIS K-7113 were cut out.

Tensile strength and elongation of the film were measured, using the said specimens, by tensile tests, according to JIS K-7113. The crosshead speed was set at 1 mm/min on the Tensilon testing apparatus.

The results of the test were shown in Table 1.

EXAMPLE 2

Using a same apparatus as described in Example 1, 250 g of bisphenol A type epoxy resin, having epoxy equivalent of 187 g/eq, 136.8 g of bisphenol A, 27.0 g of p-nonylphenol, and 50 ml of xylene were added. The content of the flask began to be heated in nitrogen atmosphere, and 0.4 ml of 5N aqueous solution of lithium chloride was added as the temperature of the content reached 70 °C. Then, the content of the flask was heated to a temperature of 185 °C., during which period xylene was stripped off at a reduced pressure. By agitating the content at a pressure of 5 mmHg and at a temperature of 185 °C. for 1 hour, xylene was completely removed.

After restoring the pressure, the reaction was carried out for 5 hours. 21.5 g of ε-caprolactone was added, and the reaction was carried out for 6 hours at 185 °C. and a resin having the OH value of 208 KOH mg/g was obtained.

The obtained resin was diluted with a solvent prepared by mixing equal weights of methylisobutyl ketone and toluene to the nonvolatile concentration of 45.2%.

Using a solution of this resin, a film was made and evaluation was carried out in the same procedure in Example 1.

The results of such evaluation are shown in Table 1.

COMPARATIVE EXAMPLE 1

The procedure of Example 1 was repeated except that bisphenol A type solid epoxy resin, having an epoxy equivalent of 2550 g/eq and a softening point of 141 °C. instead of polyol is employed.

The evaluation of the performance of film was carried out in the same procedure in Example 1.

The results were shown in Table 1.

TABLE 1

|  | Example 1 | Example 2 | Comparative Example 1 |
|---|---|---|---|
| Semi-cured time, hr | 6.4 | 6.6 | 13.1 |
| Tensile strength, kgf/mm$^2$ | 5.4 | 5.2 | 4.3 |
| Tensile modulus, kgf/mm$^2$ | 133 | 120 | 145 |
| Elongation, % | 7.2 | 7.5 | 4.0 |

Those polyol resins prepared in accordance with the above-mentioned examples possess flexibility, high curing reactivity and high storage stability.

EXAMPLES 3 AND 4

A 5-liter separable flask equipped with a stirrer, a thermometer, a nitrogen inlet, and a condenser was charged with bisphenol A type epoxy resin, having epoxy equivalent of 187 g/eq, bisphenol A and monovalent active hydrogen-containing compound in the quantities indicated in Table 2 and 250 ml of xylene. The contents were heated to a temperature of 150 °C., during which period water and xylene were stripped off at a reduced pressure. By agitating the content at a pressure of 5 mmHg and at a temperature of 150 °C. for 1 hour, xylene was completely removed.

After restoring the pressure, primary amine in the quantity indicated in Table 2 was added, and the reaction was carried out for 5 hours at 185 °C. Afterwards, ε-caprolactone in the quantity indicated in Table 2 was added and the reaction was carried out for 6 hours to obtain the polyol resin having the hydroxyl value as indicated in Table 2. Upon completion of the reaction, the obtained polyol resin was diluted with a solvent prepared by mixing equal weights of methylisobutyl ketone and toluene, and the nonvolatile content was shown in Table 2.

TABLE 2

|  | Example 3 | Example 4 |
|---|---|---|
| Bisphenol A type epoxy resin, g | 2.000 | 2.102.6 |
| Bisphenol A, g | 1.082.5 | 1.166.4 |
| Compound of active hydrogen, g | p-cumylphenol 150 | p-nonylphenol 218.5 |
| Primary amine, g | stearylamine (Farmin 80) 96.3 | cyclohexylamine 12.4 |
| Esterification agent, g | ε-caprolactone 175.2 | ε-caprolactone 184.2 |
| Product |  |  |
| hydroxyl value, KOH mg/g | 215 | 210 |
| non-volatile content, % | 45.1 | 45.0 |

The thus obtained polyol resin was evaluated with respect to the items described in Example 1, in the form of a cured film of coating prepared by compounding it with polyurethane resin (Takenate D-102 manufactured by Takeda Pharmaceutical Co.) at the NCO/OH equivalent ratio of 0.8.

The results of the test were shown in Table 3.

EXAMPLE 5

A 5-liter separable flask equipped with a stirrer, a thermometer, a nitrogen inlet, and a condenser was charged with 2186.3 g of bisphenol A type epoxy resin, having epoxy equivalent of 187 g/eq, 1105.4 g of bisphenol A and 250 ml of xylene. The content of the flask began to be heated in nitrogen atmosphener, and 0.6 ml of 5N aqueous solution of lithium chloride was added as the temperature of the content reached 70 ° C. Then, the content of the flask was heated to a temperature of 150 ° C., during which period xylene was stripped off at a reduced pressure. By agitating the content at a pressure of 5 mmHg and at a temperature of 150 ° C. for 1 hour, xylene was completely removed.

After restoring the pressure, 92.5 g of phenol and 115.8 g of laurylamine (Farmin 20D manufactured by Kao K.K.) were added, and the reaction was carried out for 5 hours at 185 ° C. Afterwards, 184.2 g of (-caprolactone was added and the reaction was carried out for 6 hours to obtain a resin having hydroxyl value of 230 KOH mg/g. The thus obtained resin was diluted with a solvent prepared by mixing equal amounts of methylisobutyl ketone and toluene. The solution of the resin was used to prepare a film of coating in the same procedure in Example 1. Results of the test to evaluate the performance of the film were shown in Table 3.

EXAMPLE 6

A 1-liter separable flask equipped with a stirrer, a thermometer, a nitrogen inlet, and a condenser was charged with 250 g of bisphenol A type epoxy resin, having an epoxy equivalent of 187 g/eq, 135.5 g of bisphenol A, 18.6 g of p-cumylphenol and 50 ml of xylene. The content of the flask began to be heated in nitrogen atmosphere, and 1 ml of 1.7N aqueous solution of lithium chloride was added as the temperature of the content reached 70 ° C. Then, the content of the flask was heated to a temperature of 150 ° C., during which period xylene was stripped off at a reduced pressure. By agitating the content at a pressure of 5 mmHg and at a temperature of 150 ° C. for 1 hour, xylene was completely removed.

After restoring the pressure, 11.8 g of stearyl amine (Farmin 80 manufactured by Kao K.K.) was added, and the reaction was carried out for 5 hours at 185 ° C. Afterwards, a Dean-Stark apparatus was attached to the reactor, and 21.9 g of stearic acid and 30 ml of xylene were added to the content, and the esterification reaction was carried out in refluxing xylene at 180° to 190 ° C. for 6 hours. In order to carry out the xylene flux smoothly, an additional quantity of xylene was added to the content as the reaction temperature exceeded 190 ° C. The water produced in the reaction was subjected to azeotropic distillation with xylene, and was removed from the system by means of separation by the Dean-Stark apparatus. Upon completion of the esterification reaction, xylene was stripped off at 190 ° C. at a reduced pressure, and a resin having a softening point of 146 ° C. and a hydroxyl value of 205 KOH mg/g was obtained. This resin was diluted with a mixed solvent prepared by mixing equal amounts of methylisobutyl ketone and toluene to a nonvolatile concentration of 44.9%.

The solution of the resin was used to prepare a film of coating in the same procedure in Example 3. Results of the test to evaluate the performance of the film were shown in Table 3.

TABLE 3

| | Example 1 | Example 2 | Example 3 | Example 4 | Comparative Example 1 |
|---|---|---|---|---|---|
| Semi-cured time, hr | 2.6 | 5.3 | 2.3 | 6.9 | 13.1 |
| Tensile strength, kgf/mm² | 5.8 | 4.8 | 5.3 | 5.5 | 4.3 |
| Tensile modulus, kgf/mm² | 136 | 121 | 127 | 134 | 145 |
| Elongation, % | 6.9 | 8.5 | 6.7 | 6.3 | 4.0 |

Those polyol resins prepared in accordance with the above-mentioned Examples possess flexibility, high curing reactivity and high storage stability when it is used for the coating application.

We claim:
1. A process for preparing a polyol resin which is substantially free of epoxy groups, which comprises modifying a bisphenol epoxy resin (a) by the steps comprising:
   (iii) reacting an epoxy group of the bisphenol epoxy resin (a) with a primary amine (b);
   (iv) reacting an epoxy group of the bisphenol epoxy resin (a) with monovalent phenol (c), in the presence or absence of a bisphenol; and
   (v) esterifying a part of the secondary hydroxyl groups of the modified bisphenol epoxy resin with an esterifying agent selected from the group consisting essentially of a lactone, a monocarboxylic acid and ester derivatives of said noncarboxylic acid, and
   wherein steps (iii), (iv) and (v) are carried out in the order of (iii), (iv) and (v) or (iv), (iii) and (v), or steps (iii) and (iv) are first carried out simultaneously and thereafter followed by step (v), and
   wherein said primary amine (b) of step (iii) and said monovalent phenol (c) of step (iv) are each reacted in respective amounts which satisfy formulae (2) and (3):

$$0.95 \leq \frac{(A/X)}{2B/Mb + C/Mc + 2D/Md} \leq 1.05 \quad (2)$$

$$2000 \leq \frac{2(A + B + C + D)}{C/Mc + |A/X - 2B/Mb - C/Mc - 2D/Md|} \leq 15000 \quad (3)$$

in which
A represents the amount of epoxy resin (a) in grams;
B represents the amount of primary amine (b) in grams;
C represents the amount of monovalent phenol (c) in grams;
D represents the amount of bisphenol in grams which is optionally present in step (iv);
X represents the epoxy equivalent of the epoxy resin (a);
Mb represents the molecular weight of the primary amine (b);
Mc represents the molecular weight of the monovalent phenol (c); and
Md represents the molecular weight of the bisphenol.

2. The process according to claim 1, wherein the esterifying agent of step (v) is a lactone, said lactone is used to the extent that the amount of polyester being graft polymerized in the finally obtained polyol resin from the secondary hydroxyl group as the starting point is from about 0.5 to 30 weight percent of the polyol resin.

3. A process according to claim 1 wherein the esterifying agent in said step (v) is a monocarboxylic acid or its ester, and the monocarboxylic acid or its ester is used to the extent that the amount of ester group in the finally obtained polyol resin is about 0.5 to 30 mole percent of the total amount of the hydroxyl group and ester group in polyol resin.

4. The process according to claim 1, wherein the bisphenol epoxy resin (a) has an epoxy equivalent of about 150 to 3500.

5. The process according to claim 1, wherein the monovalent phenol (c) has from 6 to 40 carbon atoms.

6. The process according to claim 1, wherein the monovalent phenol (c) is selected from the group consisting of phenol, cresol, isopropyl phenol, amyl phenol, nonyl phenol, dodecyl phenol, xylenol and p-cumylphenol.

7. The process according to claim 1, wherein the primary amine (b) is selected from the group consisting of aliphatic primary amine, aromatic primary amine, cycloaliphatic primary amine and aromatic nuclear substituted aliphatic amine.

8. The process according to claim 1, wherein the primary amine (b) is an aliphatic amine having from 12 to 20 carbon atoms.

9. The process according to claim 1, wherein the primary amine (b) is selected from the group consisting of propyl amine, butyl amine, hexyl amine, octyl amine, lauryl amine, stearyl amine, palmityl amine and oleyl amine.

* * * * *